US008182870B1

(12) United States Patent
Khounsary

(10) Patent No.: US 8,182,870 B1
(45) Date of Patent: May 22, 2012

(54) METHOD FOR GENERATING SMALL AND ULTRA SMALL APERTURES, SLITS, NOZZLES AND ORIFICES

(75) Inventor: Ali M. Khounsary, Hinsdale, IL (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 1028 days.

(21) Appl. No.: 12/128,696

(22) Filed: May 29, 2008

(51) Int. Cl.
*C23C 16/00* (2006.01)
*H05H 1/24* (2006.01)
(52) U.S. Cl. ............... 427/255.7; 427/248.1; 427/569
(58) Field of Classification Search ............... 427/255.7, 427/569, 248.1
See application file for complete search history.

(56) References Cited

U.S. PATENT DOCUMENTS

| | | | | |
|---|---|---|---|---|
| 4,684,565 A * | 8/1987 | Abeles et al. | ................. | 428/220 |
| 5,669,708 A * | 9/1997 | Mashima et al. | ............. | 362/341 |
| 7,760,049 B2 * | 7/2010 | Uno et al. | ...................... | 333/193 |
| 2005/0064298 A1 * | 3/2005 | Silverman | ........................ | 430/5 |
| 2005/0207536 A1 * | 9/2005 | Shiraishi | ........................ | 378/119 |
| 2005/0208389 A1 * | 9/2005 | Ishibashi et al. | .................. | 430/5 |
| 2006/0062348 A1 * | 3/2006 | Shiraishi | ........................ | 378/34 |
| 2007/0154817 A1 * | 7/2007 | Leunissen et al. | ................ | 430/5 |
| 2008/0143981 A1 * | 6/2008 | Ehm et al. | ........................ | 355/30 |

OTHER PUBLICATIONS

Liu et al. Short focal lenght Kirkpatrick-Baez mirrors for a hard x-ray nanoprobe, Nov. 2005, Review of Scientific Instruments, 76, pp. 113701-1-113701-6.*

* cited by examiner

*Primary Examiner* — Kelly M Gambetta
(74) *Attorney, Agent, or Firm* — Michael J. Dobbs; Daniel D. Park; John T. Lucas

(57) ABSTRACT

A method and device for one or more small apertures, slits, nozzles and orifices, preferably having a high aspect ratio. In one embodiment, one or more alternating layers of sacrificial layers and blocking layers are deposited onto a substrate. Each sacrificial layer is made of a material which preferably allows a radiation to substantially pass through. Each blocking layer is made of a material which substantially blocks the radiation.

21 Claims, 8 Drawing Sheets

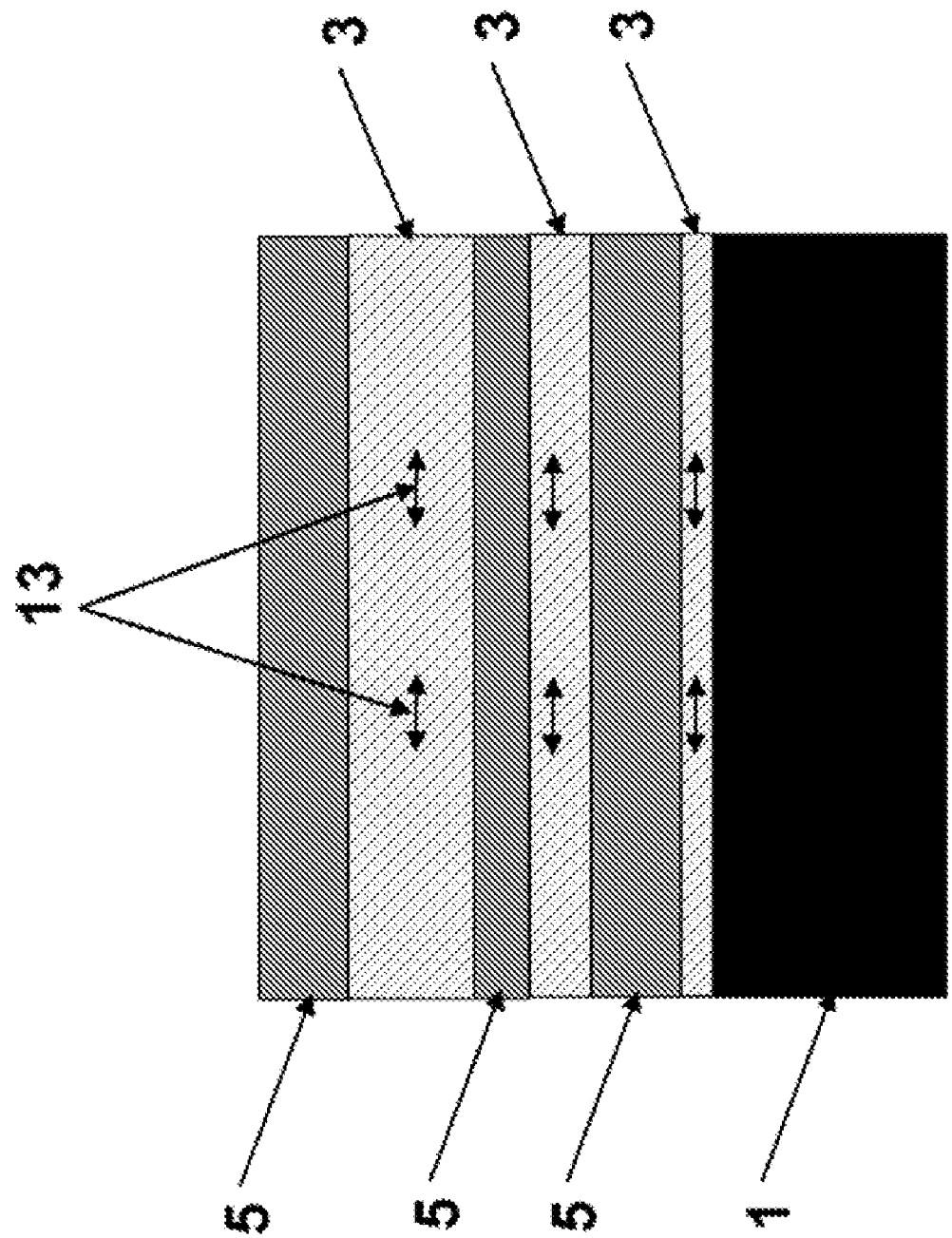

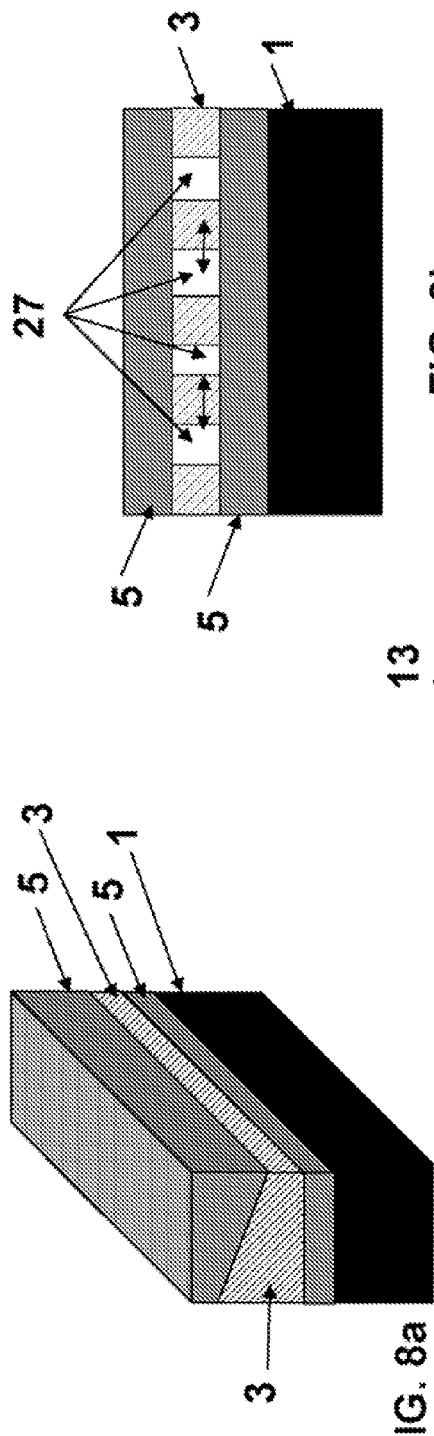
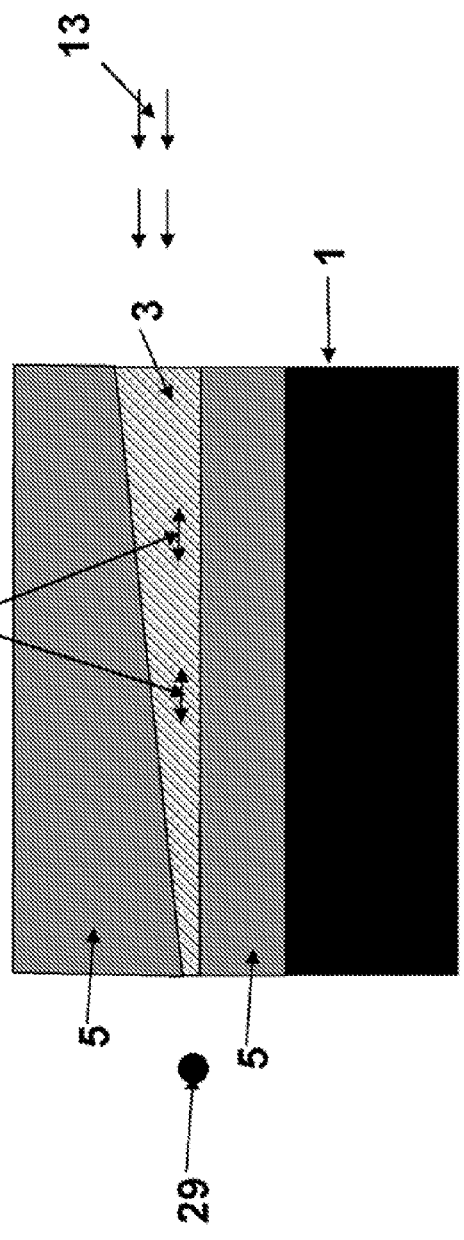
FIG. 8a
FIG. 8b
FIG. 8c

METHOD FOR GENERATING SMALL AND ULTRA SMALL APERTURES, SLITS, NOZZLES AND ORIFICES

GOVERNMENT INTERESTS

The United States Government has rights in this invention pursuant to Contract No. DE-AC02-06CH11357, between the U.S. Department of Energy (DOE) and UChicago Argonne LLC.

FIELD OF THE INVENTION

The present invention relates to a device and method for generating one or more small and ultra small apertures, slits, nozzles, orifices or masks, preferably having high aspect ratios. In a preferred embodiment, one or more apertures each have an aperture size less than about 5 microns are used to mask collimate, or condition particles, radiation, flow, fields or combinations thereof, henceforth collectively referred to as radiation.

BACKGROUND OF THE INVENTION

There are technical and industrial needs for the efficient and economical production of single and arrays of small apertures. Particularly, the production of small apertures having a large aspect ratio (length (depth) of the aperture over the aperture size) can beneit a number of applications that use slits, masks, nozzles, collimators, filters and waveguides.

There is also a great need for apertures having a small aperture size (less than about 5 microns) with large aspect ratios. For example, these small apertures can provide high contrast masking and collimation necessary for high resolution detection by allowing an intense beam of radiation to illuminate a select area of a sample.

High quality, high aspect ratio apertures can also be used for waveguide applications where radiation bounces between the walls of an aperture. Waveguides greatly benefit from smooth, high-quality apertures and walls.

Ultra small apertures have a growing number of scientific applications as well. As an example, coherent X-ray diffraction (CXD) experiments can benefit from very small apertures having a large aspect ratio. In CXD experiments one must have an aperture to slit down (narrows) an X-ray beam to dimensions smaller than the transverse coherence length of the source, typically 5 microns or less.

There have been various efforts to efficiently produce high-quality apertures using methods such as mechanical machining, wire EDM (Electrical Discharge Machining), double blade precisely polished slits and laser drilling. Unfortunately, these methods have thus far proved unable to produce cost-effective high-quality apertures. Furthermore, none of these methods are capable of producing very small apertures with large aspect ratios. These traditional fabrication tools are currently unable to produce apertures much smaller than 5 microns, especially with a large aspect ratio.

Precisely polished double blade slits have had some success in generating apertures as small as a few microns, however calibration is difficult in these systems because controlling aperatures of about 1 micron or less requires precision stages and control that adds to the physical size and cost. The physical size of these systems makes them unrealistic to use in an array of apertures.

Laser drilling is another method of creating small apertures, typically as small as 5 microns. Pulsed high-energy solid-state laser and short-pulse deep ultraviolet (UV) laser have recently produced apertures as small as a few microns. Unfortunately, laser drilling produces irregular aperture shapes as a result of the laser ablation process and is thus far unable to produce apertures having lengths in excess of a few microns. Various lithographic techniques have also been used to produce small apertures, but in select metals, with limited aspect ratios and requiring specialized facilities and tools.

Therefore it is desirable to have a method to efficiently and economically produce one or an array of high quality small and ultra small apertures, especially with high aspect ratios.

SUMMARY OF THE INVENTION

A device and method for generating one or more small or ultra small apertures, preferably having a high aspect ratio. In one embodiment, one or more alternating blocking layers and sacrificial layers are deposited onto a substrate. Each sacrificial layer is made of a material which preferably allows a selected radiation to substantially pass through. Each blocking layers is made a material which substantially blocks the selected radiation.

BRIEF DESCRIPTION OF THE DRAWINGS

FIG. 4 depicts a side view of one embodiment having a substrate coated with a plurality of alternating coatings of sacrificial layers and blocking layers, whereby a sacrificial layer is adjacent to the substrate.

FIG. 8a depicts a perspective view of one embodiment having a substrate coated with alternating sacrificial and blocking layers, whereby a sacrificial layer has a variable thickness along the width of the substrate.

FIG. 8b depicts a side view of one embodiment having a substrate coated with alternating sacrificial and blocking layers, whereby a sacrificial layer is partially removed creating one or more voids.

FIG. 8c depicts a side view of one embodiment having a substrate coated with alternating sacrificial and blocking layers, whereby a sacrificial layer has a variable thickness along the length of the substrate.

DETAILED DESCRIPTION OF THE INVENTION

A device and method for generating one or more small or ultra small apertures, preferably having a high aspect ratio. In one embodiment, one or more alternating blocking layers and sacrificial layers are deposited onto a substrate. Each sacrificial layer is made of a material which preferably allows a selected radiation, particle, field or flow (hereby selected radiation) to substantially pass through. Each blocking layers is made of a material which substantially blocks the selected radiation.

Figure 1A:
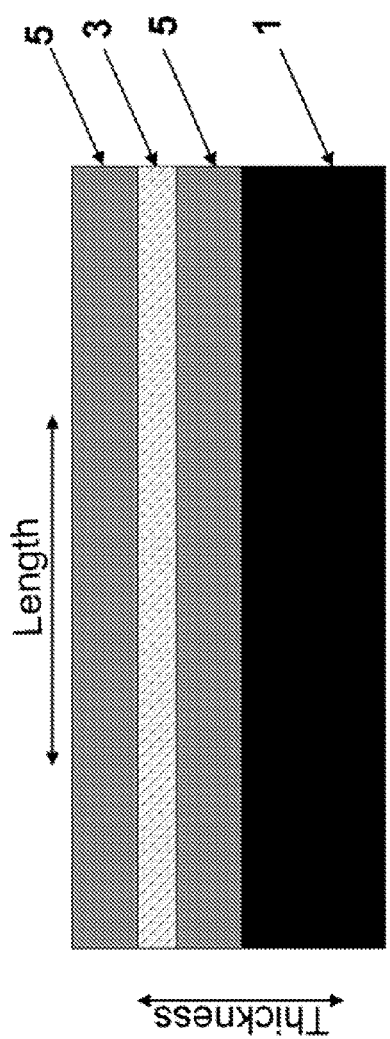
FIG. 1a depicts a side view of one embodiment having a substrate coated with alternating sacrificial and blocking layers.
Figure 1B:
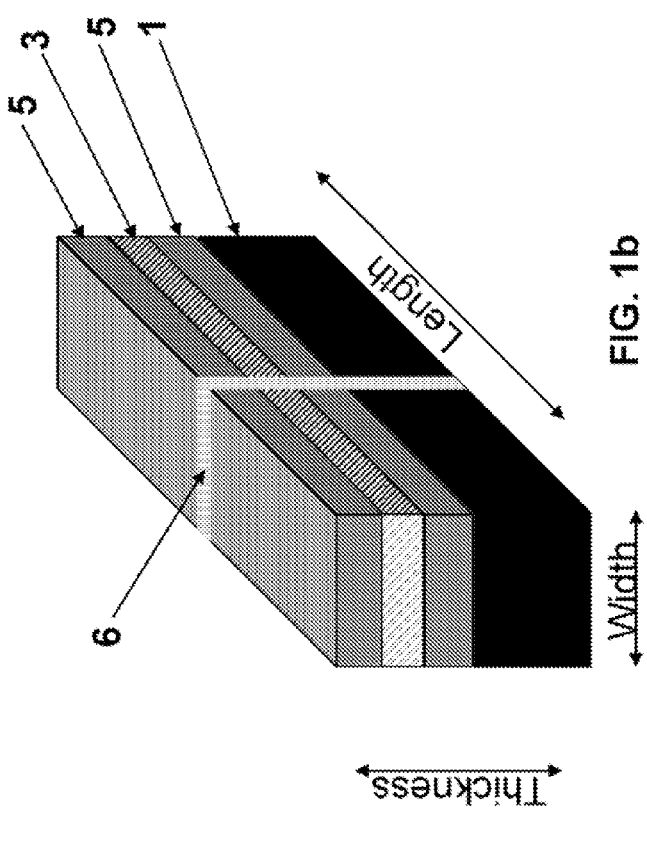
FIG. 1b depicts a perspective view of one embodiment having a substrate coated with alternating sacrificial and blocking layers, and a slice of it.

FIG. 1a and FIG. 1b

FIG. 1a and FIG. 1b depict one embodiment having a substrate 1 coated with alternating blocking layers 5 and sacrificial layers 3. In this embodiment, a blocking layer 5 is deposited onto the substrate 1 followed by a sacrificial layer 3 and finally another blocking layer 5. Preferably, the sacrificial layers 3 and blocking layers 5 are deposited on the entire surface of the substrate 1 and then cut 6 with the substrate 1 to the desired size. Although one sacrificial layer 3 and two blocking layers 5 are shown in FIG. 1a and FIG. 1b, any number of sacrificial layers 3 and blocking layers 5 may be deposited.

The sacrificial layers 3 each allow a selected radiation to substantially pass through. Conversely, the blocking layers 5 substantially block the selected radiation. Preferably, the substrate 1 is made of a low cost material which may not necessarily be blocking and a blocking layer 5 is deposited adjacent to the substrate 1 (as shown in FIG. 1a and FIG. 1b). In the alternative, a sacrificial layers 3 may be deposited onto the substrate 1 followed by a blocking layer 5, whereby the substrate 1 preferably blocks the selected radiation (as shown in FIG. 4).

Preferably, for embodiments benefitting from a small aperture size, the sacrificial layers 3 of FIG. 1a and FIG. 1b and the blocking layers 5 are deposited by methods such as atomic layer deposition (ALD), chemical vapor deposit (CVD), sputtering plasma assisted deposition, an rf cavity, electroplating or combinations thereof. In the alternative, preferably for embodiments utilizing larger apertures, it may be more cost effective to deposit the sacrificial layers 3 and the blocking layers 5 by such methods as electroplating, dipping, spray, chemical reaction, rf cavity, thermal deposition or combinations thereof.

Substrate 1

The substrate 1 provides structural support for the sacrificial layers 3 and the blocking layers 5. Preferably, the substrate 1 has a smooth, defined surface optimized for the desired use. Preferably, the substrate 1 is made of highly polishable materials such as silicon, silicon carbonate, glasses, etc. . . . Preferably, the substrate is thick enough for polishing and coating purposes, with its length and width large as needed, has a length longer than its thickness or width.

As the substrate 1 will dictate the shape and smoothness of the sacrificial layers 3 and blocking layers 5, the shape and smoothness of the substrate 1 is preferably optimized for the desired shape and smoothness of the sacrificial layers 3 and blocking layers 5. Preferably, the substrate 1 has a defined surface designed for optimal use. Preferably, the defined surface of the substrate 1 is a flat smooth surface. However, for some applications the substrate can have such defined shapes as spherical, cylindrical and other complex shapes. Preferably, the substrate 1 has a defined surface which is very smooth having a peak-to-valley thickness less than 1/10 the thickness of a sacrificial layer 3, preferably the thinnest sacrificial layer 3. In one embodiment, the substrate 1 has a defined surface which has a shape running along its length. In another embodiment, the substrate 1 has a defined surface which has shape running along its width. In yet another alternate embodiment, the sacrificial layers 3 each have arbitrarily variable thickness across the surface of the substrate 1.

In one embodiment, the substrate 1 has a cylindrical shape. In this embodiment, the sacrificial layers 3 and the blocking layers 5, either uniform or non-uniform, create slits acting as an annulus aperture. This embodiment may be desirable to focus radiation as in a zone plate. In another embodiment, the substrate 1 acts as a blocking layer while also providing structural support.

Preferably, the substrate 1, blocking layers 5 and sacrificial layers 3 are constructed having lengths and widths longer than desired and subsequently cut, preferably using mechanical, laser, ion, ultrasound tools or thinning by polish. Cutting the substrate 1, blocking layers 5 and sacrificial layers 3 will generally be more appropriate (from manufacturing stand point) and economical than trying to construct the desired size. The substrate 1, blocking layers 5 and sacrificial layers 3 are preferably cut to shorten the length of the substrate 1 blocking layers 5 and sacrificial layers 3. Each blocking layer 5 of each resulting slice should have a length long enough to substantially block the selected radiation. Preferably, each blocking layer 5 of each resulting slice has a length greater than two extinction lengths for the selected radiation.

Sacrificial Layer 3

The sacrificial layers 3 each allow the selected radiation to substantially pass through. Preferably, the sacrificial layers 3 each allow the radiation to pass through unaffected. Preferably, at least about 10 percent more preferably about 50 percent of the selected radiation to pass through each sacrificial layer 3. In a preferred embodiment, at least 90 percent of the radiation to passes through each sacrificial layer 3. In one embodiment, the selected radiation is intentionally attenuated by one or more suitable sacrificial layers 3 resulting in a lower transmission.

Preferably, the sacrificial layers 3 each have thickness less than about 5 microns. More preferably, the sacrificial layers 3 each have a thickness between about 1 nm to about 5 microns. In a preferred embodiment, the substrate 1, each sacrificial layer 3 and each blocking layer 5 have a length greater than about 1 mm. Preferably, the substrate 1, each sacrificial layer 3 and each blocking layer 5 have a length at least 100 times greater than the thickness of a sacrificial layer 3. In one embodiment, each layer (sacrificial layer 3, blocking layer 5 and substrate 1) has a length up to about $10^8$ times greater than the thickness of the thinnest sacrificial layer 3.

Preferably, the sacrificial layers 3 is made of a material which allows the selected radiation to pass through substantially unaffected. Preferably, the sacrificial layers 3 are made of light elements such as lithium, beryllium, boron, silicon, carbon or combinations thereof.

In an alternate embodiment, one or more sacrificial layers 3 are each subsequently partially removed creating one or more voids which allows the selected radiation to pass through the voids created by the removed sacrificial layers 3. Preferably, the sacrificial layers 3 are partially removed by such methods as selective etching, chemical treatment, ion milling or thermal treatment.

In one embodiment, one or more sacrificial layers 3 are formed by a monolayer, a single, closely packed layer of atoms, molecules or cells. In some instances, preferably, Atomic Layer Deposition (ALD) technique is used to deposit monolayers. In a preferred embodiment, the sacrificial layers 3 each has a thickness of about 1 nm and a length of at least one meter, giving an aspect ratio of at least $10^9$.

The sacrificial layers 3 each conform to the substrate surface. In one embodiment, the sacrificial layers 3 each have a defined thickness varying along the length of the substrate 1. In yet another alternate embodiment, the sacrificial layers 3 each have a defined thickness varying along the width of the substrate 1

Therefore, each sacrificial layer 3 creates an aperture (slit, nozzle or orifice) which allows the selected radiation to substantially pass through the length of the sacrificial layer 3 largely unaffected.

Blocking Layer 5

The blocking layers 5 each substantially prevent the selected radiation from passing through. Preferably, the blocking layers 5 each prevents at least 10 percent, more preferably 50 percent, of the selected radiation from passing through. In a preferred embodiment, at least 90 percent of the selected radiation is prevented from passing through. Preferably, each blocking layer 5 absorbs or reflects the selected radiation.

Preferably each blocking layer 5 has a thickness greater than about or larger than the thickness of a sacrificial layer 3. More preferably each blocking layer 5 has a thickness capable of substantially blocking the selected radiation. Preferably each blocking layer 5 has a length (along the length of the substrate) greater than about two extinction lengths for the selected radiation. Preferably, each blocking layer 6 maintains a uniform thickness to ensure a uniform blocking of the selected radiation.

In a preferred embodiment X-rays are the selected radiation and the blocking layer 5 is made of a heavy element such as gold or a gold alloy. Preferably, the blocking layers 5 each have a length greater than about two extinction lengths for the selected X-rays. In a preferred embodiment, each blocking layer 5 has a length between about 10 and 1,000 microns.

The blocking layers 5 each conform to the substrate 1 surface. In one embodiment, the blocking layers 5 each have a defined thickness having a shape running along the length of the substrate 1. In yet another alternate embodiment, the blocking layers 5 each have a defined thickness having a shape running along the width of the substrate 1.

FIG. 2

Figure 2:
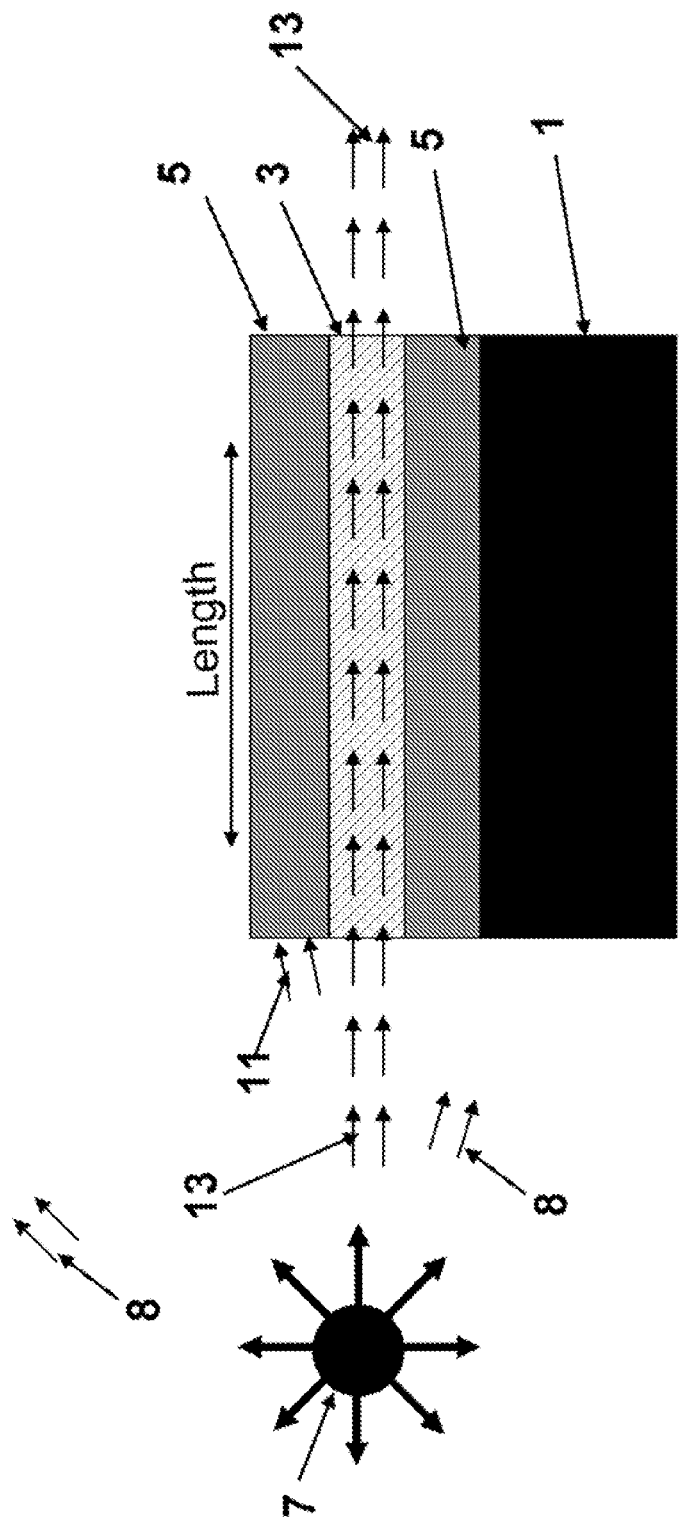
FIG. 2 depicts a side view of one embodiment having a substrate coated with alternating sacrificial and blocking showing the collimation of a part of a point source.

FIG. 2 depicts the embodiment shown in FIG. 1a with the addition of a radiation source 7 producing a selected radiation 8. As shown in FIG. 2, the radiation 8 passes through the sacrificial layers 3 substantially unaffected creating a beam 13 of the radiation 8 and therefore collimating a part of the radiation source 7. Conversely, the blocking layers 5 substantially prevent the radiation 8 from passing, creating blocked radiation 11. In the alternative, sacrificial layers 3 may be adjacent to the substrate 1, whereby the substrate 1 preferably blocks the radiation 8.

The Selected Radiation 8

The selected radiation 8, a particle, radiation, field or flow, is selected depending on the application. For example, for X-ray collimators the radiation 8 is an X-ray and the sacrificial layers 3 preferably has small aperture and a long length whereby only parallel travelling X-rays are passed through, thereby collimating at least a part of the radiation source 7. Other examples of radiation include, but are not limited to: neutrons, protons, electrons, gamma rays, charged particles, accelerated particles, fields, etc.

Figure 3B:
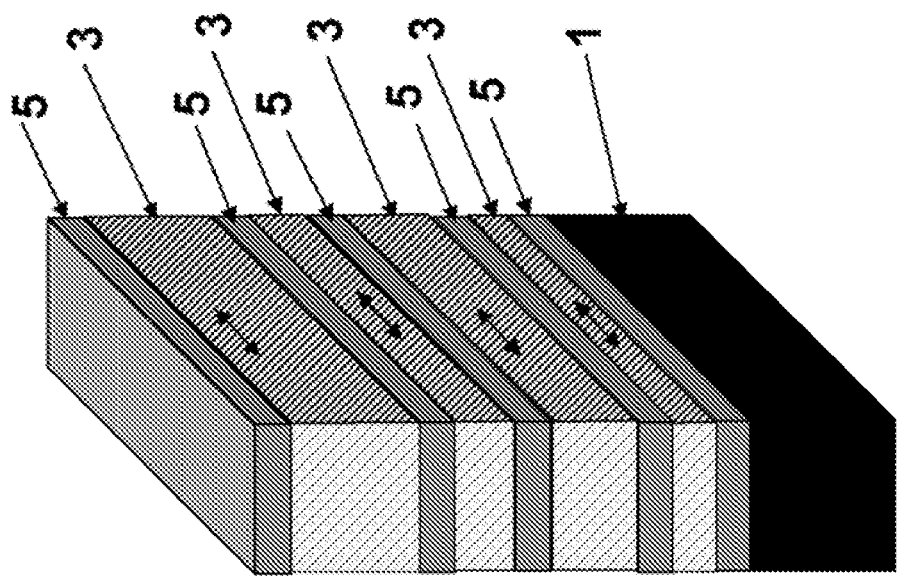
FIG. 3b depicts a perspective view of one embodiment having a substrate coated with a plurality of alternating sacrificial and blocking layers whereby a blocking layer is adjacent to the substrate.
Figure 3A:
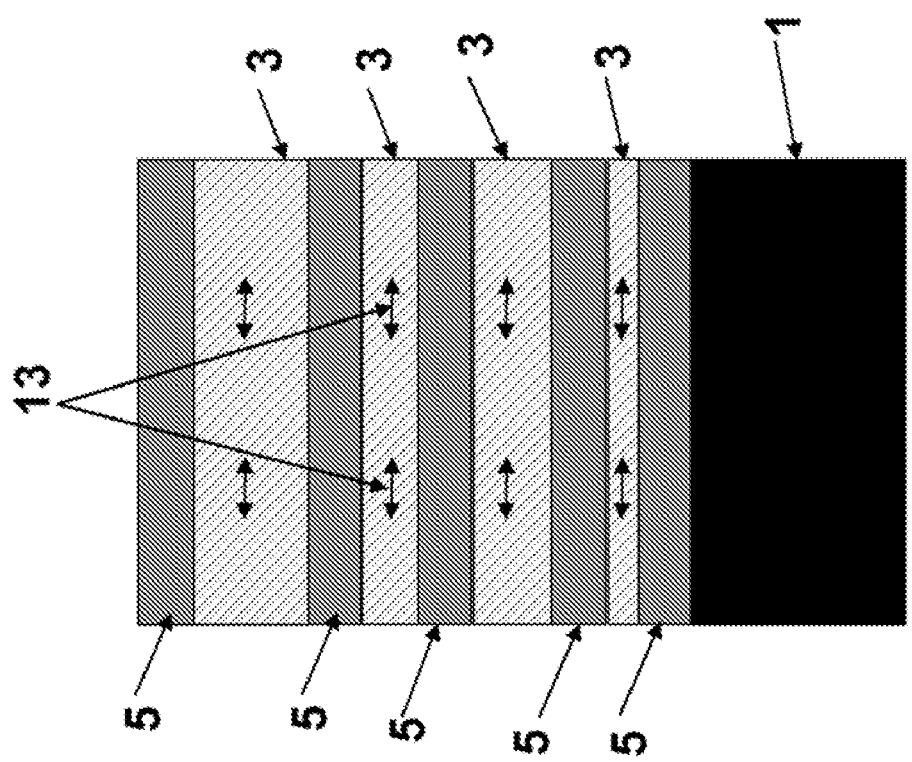
FIG. 3a depicts a side view of one embodiment having a substrate coated with a plurality of alternating sacrificial and blocking layers, whereby a blocking layer is adjacent to the substrate.

FIG. 3a, FIG. 3b and FIG. 4

FIG. 3a, FIG. 3b and FIG. 4 depict an embodiment having the substrate 1 and the plurality of the alternately stacked sacrificial layers 3 and the blocking layers 5 described for the embodiment shown in FIG. 1a and FIG. 1b.

In the embodiment depicted in FIG. 3a and FIG. 3b, a blocking layer 5 is positioned between the substrate 1 and a sacrificial layers 3. In the alternative, the embodiment shown in FIG. 4 may be used whereby a sacrificial layers 3 is positioned between the substrate 1 and a blocking layer 5. Preferably, the layer furthest from the substrate 1 is a blocking layer 5.

The substrate 1, each sacrificial layer 3, each blocking layer 5 or a combination thereof, may each have unique shapes and sizes. For example, each layer may have a unique shape, thickness, length, width or combination thereof. In one embodiment, the sacrificial layers 3 have the same width and thickness as each other. In the alternative, each sacrificial layer 3 has a unique thickness. In one embodiment, each blocking layer 5 has a thickness larger than a sacrificial layer 3. In another embodiment, each sacrificial layer 3 has a thickness larger than the blocking layer 5.

FIG. 5

Figure 5:
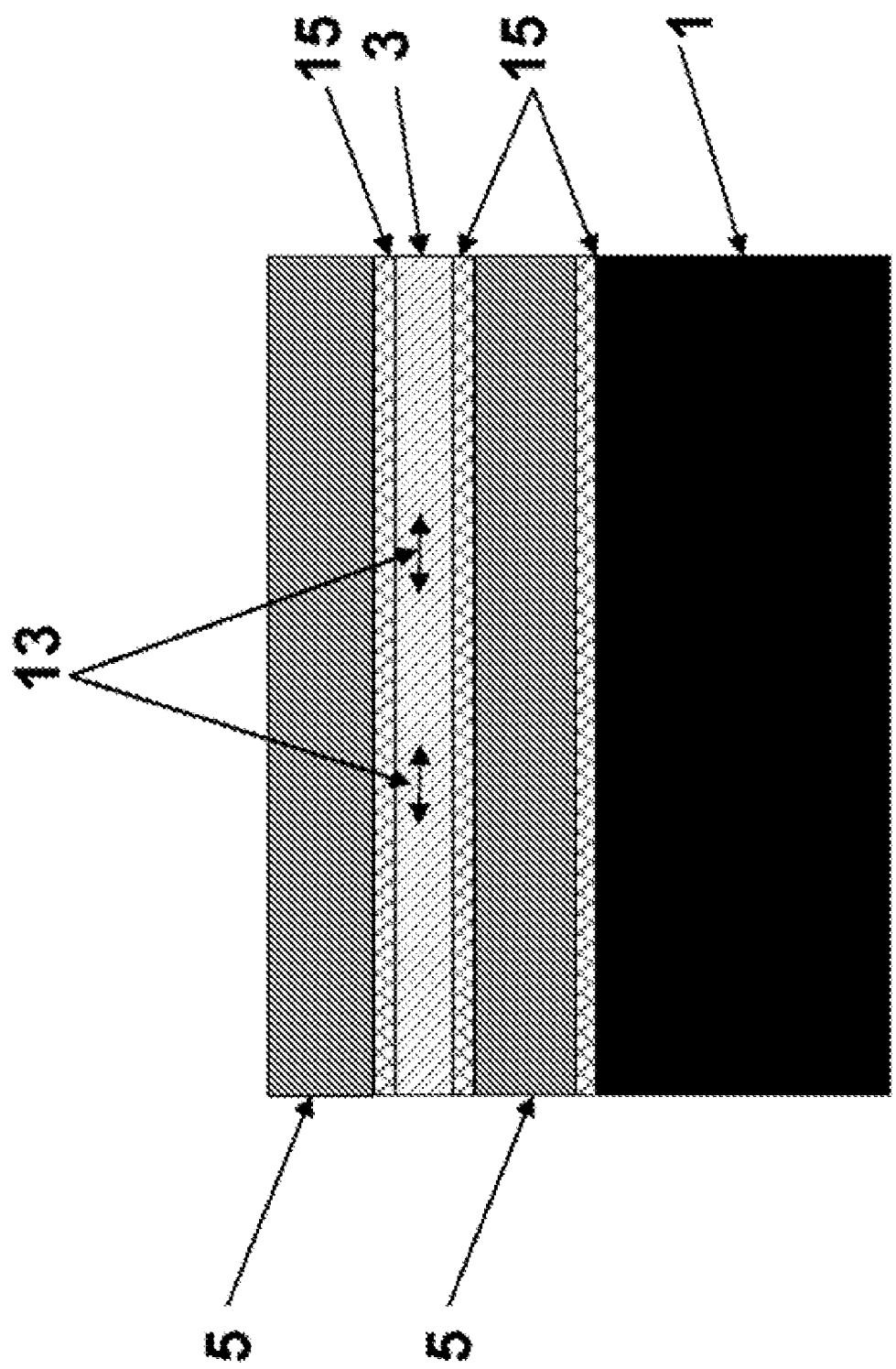
FIG. 5 depicts a side view of one embodiment having a substrate coated with alternating sacrificial and blocking layers connected by adhesive layers.

FIG. 5 depicts the embodiment shown in FIG. 3a and FIG. 3b with the addition of one or more adhesive layers 15 between the substrate 1 and the adjacent alternating sacrificial layers 3 and blocking layers 5 and one or more adhesive layers 15 between each sacrificial layers 3 and blocking layer 5. In the alternative, one or more adhesive layers of the one or more adhesive layers 15 may be omitted. For example, the layer adjacent (sacrificial layers 3 or blocking layer 5) to the substrate 1 may be directly deposited onto the substrate 1, whereby the bond between the deposited layer and the substrate 1 alone is sufficient to maintain the structure. Likewise, the one or more adhesive layer 15 between each sacrificial layer 3 and the corresponding blocking layer 5 may also be omitted. Although FIG. 5 depicts a blocking layer 5 adjacent to the substrate 1, a sacrificial layer 3 may be deposited adjacent to the substrate 1 instead of the blocking layer 5.

One or More Adhesive Layers 15

The one or more adhesive layers 15 help connect the various layers. Therefore, an adhesive layer 15 between the substrate 1 and an adjacent sacrificial layer 3 connects the substrate 1 to the adjacent sacrificial layer 3. Alternately, in an embodiment whereby a blocking layer 5 is adjacent to the substrate 1, an adhesive layer 15 between the substrate 1 and a blocking layer 5 connects the substrate 1 to the blocking layer 5. Likewise, an adhesive layer 15 between the sacrificial layers 3 and an adjacent blocking layer 5 connects the sacrificial layer 3 to the adjacent blocking layer 5.

Preferably, the one or more adhesive layers 15 are selected to optimize the bonding between the adjacent layers. In one embodiment, chromium or titanium are used as an adhesive.

Other layers may also be used with or without the one or more adhesive layer 15. For example, in one embodiment a diffusion layer is added as a layer placed between the two adjacent layers to preferred embodiment, the one or more adhesive layers 15 serve as a diffusion layer. Preferably, each adhesive layer 15 acts as a diffusion layer and may contain such elements as nickel, nichrome, tantalum, hafnium, niobium, zirconium, vanadium, tungsten or a combination thereof. In an alternate embodiment, the one or more adhesive layers 15 act as a diffusion layer and are made of a conductive ceramic and are preferably made of tantalum nitride, indium oxide, copper silicide or titanium nitride. Other functional layers may be added in place of or in addition to the adhesive layers 15, to provide diffusion layer, moderating layers, support layers, or functional layers to provide specific effect, performance, or function.

Figure 6C:
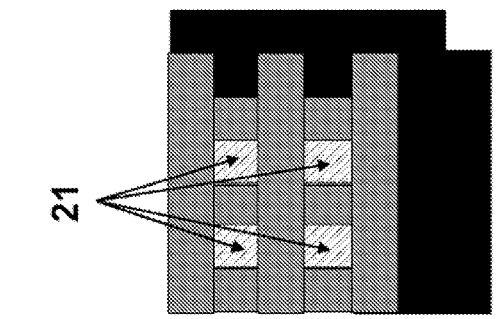
FIG. 6c depicts a side view of one embodiment using the first slice shown in FIG. 6a, the second slice shown in FIG. 6b coplanarly stacked.
Figure 6A:
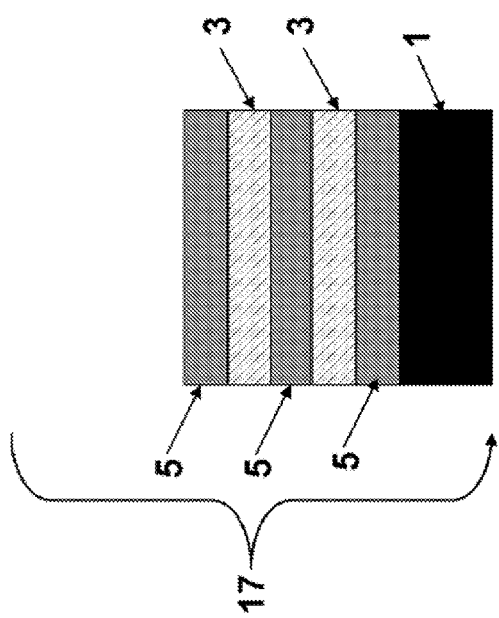
FIG. 6a depicts a side view of a first slice for the embodiment shown in FIG. 6c.
Figure 6B:
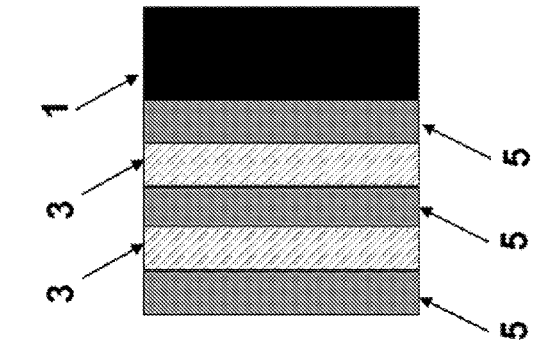
FIG. 6b depicts a side view of a second slice rotated 90 degrees for the embodiment shown in FIG. 6c.

FIG. 6a, FIG. 6b and FIG. 6c

FIG. 6a depicts a first slice 17 cut from the embodiment shown in FIG. 3a and FIG. 3b having the substrate 1, one or more blocking layers 5 and one or more sacrificial layers 3. FIG. 5b depicts a second slice 19 cut from the embodiment shown in FIG. 3a and FIG. 3b having the substrate 1, one or more blocking layers 5 and one or more sacrificial layers 3. The second slice 19 is also rotated 90 degrees about the axis planar with the length of the substrate 1 and rotated whereby the first slice 17 and the second slice 19 are coplanar. Therefore each alternating layer of the first slice 17 is perpendicular and coplanar with each alternating layer of the second slice 19. Therefore the sacrificial layers 3 and the blocking layers 5 of the second slice 19 are about 90 degrees relative to the sacrificial layers 3 and the blocking layers 5 of the first slice 17.

FIG. 6c depicts the coplanar alignment of the first slice 17 and the second slice 19 which generates a plurality of sacrificial apertures, slits, nozzles or orifices 21 comprised of the sacrificial layers 21 of the first slice 19 and the sacrificial layers 21 of the second slice 21. Therefore, the radiation 8 will substantially pass through the sacrificial apertures 21. However, the radiation 8 not passing through the sacrificial apertures 21 will be blocked by the blocking layer 5, substrate 1 or combination thereof of the first slice 17, second slice 1 or a combination thereof.

Preferably, the first slice 17 and the second slice 19 are cut preferably using mechanical, laser, ion, ultrasound tools or thinning by polish. Preferably, the cut ends of the first slice 17 and the second slice 19 are polished. Preferably, the first slice 17 and the second slice 19 are assembled and aligned in a fixture.

In the alternative, the sacrificial apertures 21 may have other shapes and configurations. For example, the first slice 17 and the second slice 19 can be rotated at various angles such that the layers are at an angle not perpendicular from each other.

FIG. 7

Figure 7:
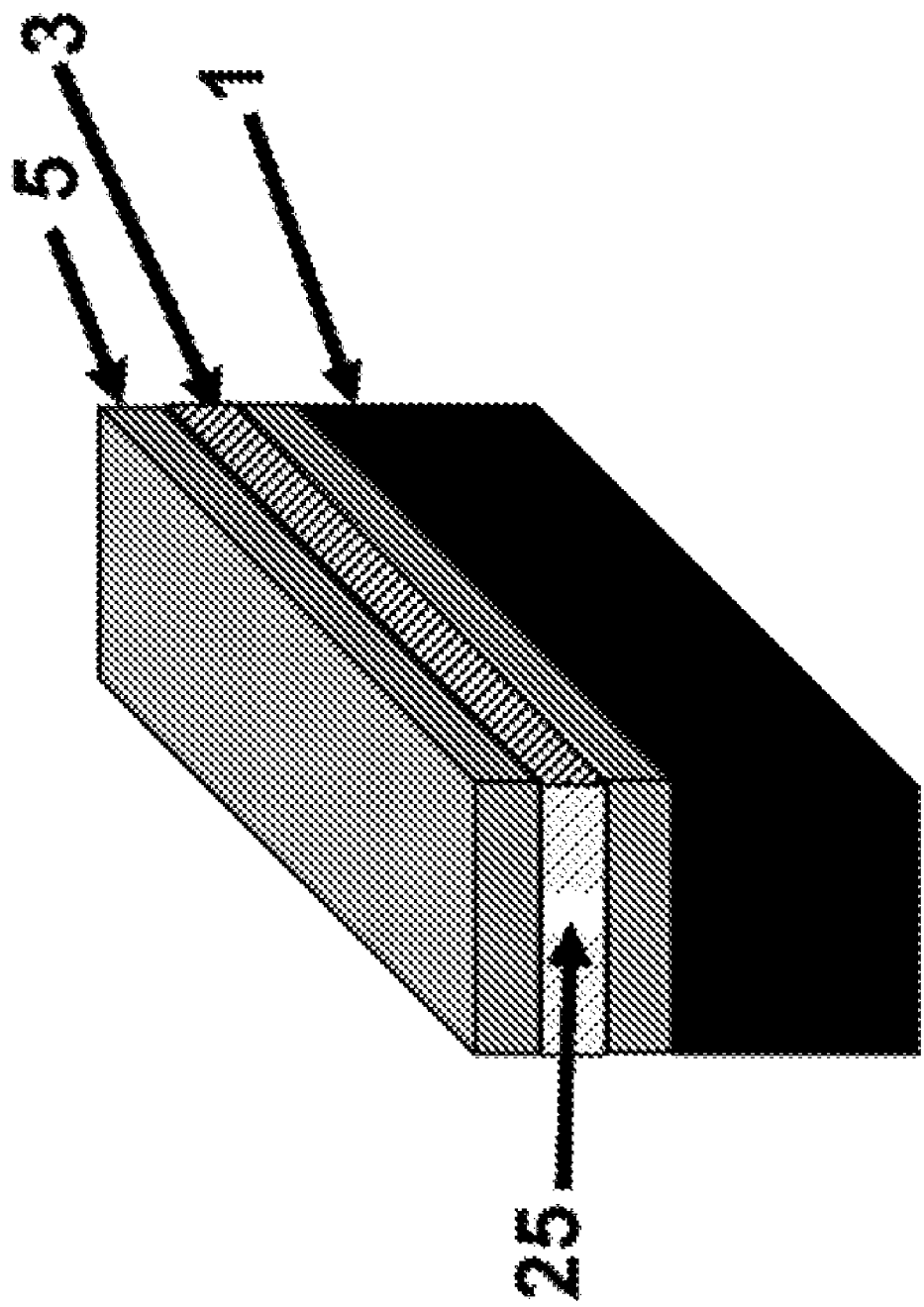
FIG. 7 depicts a perspective view of one embodiment having a substrate coated with alternating sacrificial and blocking layers, whereby a sacrificial layer is partially removed creating a void.

FIG. 7 depicts a perspective view of one embodiment having a substrate 1 with alternating coatings of sacrificial layers 3 and blocking layers 5 whereby a sacrificial layer 3 is partially removed creating a void 25. Preferably, the sacrificial layer 3 is partially removed by such methods as selective etching, chemical treatment, ion milling or thermal treatment.

In the embodiment shown in FIG. 7, a void 25 is created by removing a portion of one or more sacrificial layers 3 creating a void 25 traveling along the length of each sacrificial layers 3. This embodiment may be beneficial since the remaining part of each sacrificial layer 3 may provide structural support to prevent collapse of one or more sacrificial layers 3 or blocking layers 6. This embodiment may also be beneficial as the radiation passing through the void 25 may have a beneficial impact when reacting with the sacrificial layers 3 which is not part of the void 25 as well as with the blocking layers 5. For example, having various walls for the radiation may be beneficial in waveguides or other situations where it may be desirable for radiation to bounce within or interact with the interior of the void 25 and the adjacent remaining sacrificial layers 3 and blocking layers 5.

The void 25 may run through the sacrificial layers 3 at alternative locations. For example, in one embodiment the void 25 runs adjacent to a blocking layer 5. Although only one void 26 is shown in FIG. 7, any number of voids 25 may be used in any number of sacrificial layers 3.

FIG. 8a

FIG. 8a depicts a perspective view of one embodiment having a substrate 1 with alternating coatings of sacrificial layers 3 and blocking layers 5 whereby a sacrificial layer 3 has a gradient running along its width (the width of the substrate). In this embodiment, each sacrificial layer 3 has a varying thickness across its width. Preferably, the thickness of each sacrificial layers 3 changes in a linear fashion as shown in FIG. 8a. This embodiment is greatly beneficial as a variable aperture, whereby by moving the aperture across the incident beam, the size of the beam passing through is selected. Although FIG. 8a depicts a gradient running along the width of a sacrificial layer, a gradient may run along the thickness. In the alternative, other shapes and gradients, along the width, the length, or both may be used, such as sinusoidal, rectangular, ovular or exponentially changing shaped gradients may be used.

In one embodiment, each sacrificial layers 3 may be composed of one or more than one homogenous element, and may have a gradient in material, density, and other physical attributes including metals, non-metals, intermetalics, ceramics, etc. whereby some, or all of the radiation passing through are advantageously affected.

FIG. 8b

FIG. 8b depicts a side view of one embodiment having a substrate 1 with alternating coatings of sacrificial layers and blocking layers 5 whereby the sacrificial layers 3 are partially removed creating one or more voids 27 within the length of the sacrificial layer 3. This embodiment may be beneficial to attenuate the radiation 8 passing through the sacrificial layers 3 while also increasing the structural support of sacrificial layers 3, thereby reducing the chance of the collapse of one or more sacrificial layers 3 or one or more blocking layers 5.

FIG. 8c

FIG. 8c depicts a side view of one embodiment having a substrate 1 with alternating coatings of sacrificial layers 3 and blocking layers 5 whereby each sacrificial layer 3 has a gradient running along its length the length of the substrate). In this embodiment, each sacrificial layer 3 has a varying thickness across its length. Preferably, the thickness of each sacrificial layer 3 changes in a linear fashion as shown in FIG. 8c. In the alternative, other shapes and gradients, along the width, the length, or both may be used, such as sinusoidal, rectangular, ovular or exponentially changing shaped gradients may be used.

In this embodiment, each blocking layer 5 is preferably reflective to the radiation 8 and the radiation 8 is transmitted into the larger aperture of each sacrificial layer 3 whereby the reflectivity of the sacrificial layer 3 will focus the radiation into a focal point 29. Preferably, each sacrificial layer 3 has a gradient whereby at least some, but not all of the radiation 8 is allowed to pass.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

All publications and patent documents cited in this application are incorporated by reference in their entirety for all purposes to the same extent as if each individual publication or patent document were so individually denoted.

Any element in a claim that does not explicitly state "means for" performing a specified function or "step for" performing a specific function, is not to be interpreted a "means" or "step" clause as specified in 35 U.S.C. §112, 116.

In particular, the use of "step of" in the claims herein is not intended to invoke the provisions of 35 U.S.C. §112, ¶6.

The invention claimed is:

1. A method comprising the steps of:
   a. providing a substrate; and
   b. depositing alternating one or more sacrificial layers and one or more blocking layers onto said substrate; whereby
      i. each said blocking layer substantially blocking a selected radiation, particle, field or flow along the length of the corresponding blocking layer;
      ii. each said sacrificial layer comprises a means for substantially passing said selected radiation, particle, field or flow along the length of the corresponding sacrificial layer;
      iii. each said blocking layer prevents at least 50% of said selected radiation, particle, field or flow from passing through; and
      iv. each said sacrificial layer allows at least 50% of said selected radiation, particle, field or flow to pass through.

2. The method of claim 1 whereby said step of depositing alternating layers comprises depositing a blocking layer juxtaposed to said substrate.

3. The method of claim 1 whereby said step of depositing alternating layers comprises depositing a sacrificial layer juxtaposed to said substrate.

4. The method of claim 1 whereby:
   a. each said sacrificial layer has a thickness less than about 5 microns; and
   b. said substrate, each said sacrificial layer and each said blocking layer has a length greater than about 1 mm.

5. The method of claim 1 whereby said substrate, each said sacrificial layer and each said blocking layer have a length at least 100 times greater than the thickness of a sacrificial layer.

6. The method of claim 1 whereby a sacrificial layer from said one or more sacrificial layers has a thickness of said selected radiation.

7. The method of claim 1 further comprising partially removing a sacrificial layer after said step of depositing one or more layers.

8. The method of claim 1 whereby said step of depositing alternating layers comprises depositing a single sacrificial layer.

9. The method of claim 1 whereby said step of depositing alternating layers comprises depositing a plurality of sacrificial layers and a plurality of blocking layers.

10. The method of claim 1 whereby said substrate has a smooth surface having a peak-to-valley thickness less than $1/10$ the thickness of a sacrificial layer.

11. The method of claim 1 whereby each said sacrificial layer has a gradient running along its width or thickness.

12. The method of claim 1 whereby each said sacrificial layer has a gradient running along its length.

13. The method of claim 1 further comprising:
   a. depositing an adhesive layer connected to and between said substrate and said alternating layers; and
   b. depositing an adhesive layer connected to and between each said sacrificial layer and said blocking layer.

14. The method of claim 1 further comprising:
   a. cutting said substrate with said deposited one or more alternating layers creating a first slice and second slice each comprising a cut end, whereby each said blocking layer of said first slice has a length greater than two extinction lengths for the selected radiation; and each said blocking layer of said second slice has a length greater than two extinction lengths for said selected radiation;
   b. smoothing said cut end of said first slice and said cut end of said second slice;
   c. rotating said smoothed first slice and said smoothed second slice relative to each other; and
   d. positioning said rotated first slice and said rotated second slice whereby each said alternating layer of said first slice is perpendicular and coplanar with each said alternating layer of said second slice.

15. The method of claim 1 whereby each said sacrificial layer has a unique thickness.

16. The method of claim 1 whereby said sacrificial layers have the same width and thickness as each other.

17. The method of claim 1 whereby each said blocking layer has a length greater than two extinction lengths for the selected radiation.

18. The method of claim 1 whereby:
   a. said selected radiation is an X-ray;
   b. said step of depositing alternating layers comprises depositing a blocking layer onto said substrate;
   c. each said blocking layer has a length of about two extinction lengths for the selected radiation are blocked;
   d. each said sacrificial layer has a thickness between about 1 nm to about 5 microns;
   e. said substrate, each said sacrificial layer and each said blocking layer has a length greater than about 1 mm;
   f. said step of depositing one or more layers comprises depositing a plurality of sacrificial layers and a plurality of blocking layers;
   g. said substrate has a smooth surface having a peak-to-valley thickness less than $1/10$ the thickness of a sacrificial layer;
   h. said step of depositing alternating layers comprises:
      i. depositing each said sacrificial layer using a deposition technique from the group of deposition techniques consisting of: atomic layer deposition (ALD), chemical vapor deposition (CVD), sputtering, plasma assisted deposition, an rf cavity, electroplating and combinations thereof; and
      ii. depositing each said blocking layer using a deposition technique from the group of deposition techniques consisting of: atomic layer deposition (ALD), chemical vapor deposition (CVD), sputtering, plasma assisted deposition, an rf cavity, electroplating and combinations thereof; and
   i. each said sacrificial layer comprises a material from the group of materials consisting of: lithium, beryllium, boron, silicon, carbon and combinations thereof;
   j. further comprising depositing an adhesive layer connected to and between said substrate and said alternating layers; and
   k. further comprising depositing an adhesive layer connected to and between each said sacrificial layer and said blocking layer.

19. The method of claim 18 whereby each said sacrificial layer has a gradient running along its width or thickness.

20. The method of claim 1 whereby:
   a. each said blocking layer prevents at least 90% of passing said selected radiation, particle, field or flow from passing through; and
   b. each said sacrificial layer allows at least 90% of passing said selected radiation, particle, field or flow to pass through.

21. The method of claim 1 further comprising:
   a. removing at least one said sacrificial layer.

* * * * *